United States Patent [19]
Suzuki et al.

[11] Patent Number: 5,640,359
[45] Date of Patent: Jun. 17, 1997

[54] WORD DRIVER CIRCUIT AND A MEMORY CIRCUIT USING THE SAME

[75] Inventors: Takaaki Suzuki; Yoshihiro Takemae; Masao Nakano, all of Kawasaki, Japan

[73] Assignee: Fujitsu Limited, Japan

[21] Appl. No.: 686,385

[22] Filed: Jul. 25, 1996

[30] Foreign Application Priority Data

Dec. 27, 1995 [JP] Japan .................................. 7-340615

[51] Int. Cl.$^6$ .................................................. G11C 8/00
[52] U.S. Cl. ................................ 365/230.06; 365/149
[58] Field of Search ............................. 365/230.06, 149, 365/230.01, 230.03

[56] References Cited

U.S. PATENT DOCUMENTS 5,532,971  7/1996  Tanaka et al. ................. 365/230.06

Primary Examiner—David C. Nelms
Assistant Examiner—F. Niranjan
Attorney, Agent, or Firm—Staas & Halsey

[57] ABSTRACT

The present invention relates to a word driver circuit provided in a memory circuit. The word driver circuit comprises a P channel and an N channel transistor having a gate electrode commonly connected and one source or drain electrode commonly connected. The N channel transistor has another source or drain electrode connected to a ground. A word line is connected to the commonly connected source or drain electrode of the transistors. A first selection signal, generated by decoding a first group of address signals, whose potential is either a first potential by which the N channel transistor is rendered conductive or a second potential lower than the first power supply is supplied to the gate electrodes. And a second selection signal, generated by decoding a second group of address signals, whose potential is either a third potential of the selected word line or a fourth potential equal or lower than the first power supply is supplied to another source or drain of the P transistor.

14 Claims, 9 Drawing Sheets

| MAIN WORD | SELECT | | NON-SELECT | |
|---|---|---|---|---|
| SUB-WORD | SELECT | NON-SELECT | SELECT | NON-SELECT |
| MWX | VBB (LL) | VBB (LL) | VCC (H) | VCC (H) |
| SWD | SVC (H) | VSS (L) VBB (LL) | SVC (H) | VSS (L) VBB (LL) |
| WL | SVC (H) | VBB + Vth (L) | VSS (L) | VSS (L) |

| MAIN WORD | SELECT | | NON-SELECT | |
|---|---|---|---|---|
| SUB-WORD | SELECT | NON-SELECT | SELECT | NON-SELECT |
| MWX | Vss (L) | Vss (L) | Vcc (H) | Vcc (H) |
| MWZ | Vcc (H) | Vcc (H) | Vss (L) | Vss (L) |
| SWD$_0$ | SVc (H) | Vss (L) | SVc (H) | Vss (L) |
| WL | SVc (H) | Vss (L) | Vss (L) | Vss (L) |

| MAIN WORD | SELECT | | NON-SELECT | |
|---|---|---|---|---|
| SUB-WORD | SELECT | NON-SELECT | SELECT | NON-SELECT |
| MWX | Vss (L) | Vss (L) | Vcc (H) | Vcc (H) |
| SWDZ | SVc (H) | Vss (L) | SVc (H) | Vss (L) |
| SWDX | Vss (L) | Vcc (H) | Vss (L) | Vcc (H) |
| WL | SVc (H) | Vss (L) | Vss (L) | Vss (L) |

WORD DRIVER CIRCUIT AND A MEMORY CIRCUIT USING THE SAME

BACKGROUND OF THE INVENTION

1. Field of the Invention

The present invention relates to a memory circuit, and in particular to the improvement of a word driver circuit in the memory circuit.

2. Related Arts

The development of a DRAM, etc., of which memory having a large capacity is fabricated on semiconductor substrate has been aggressively pursued. The memory having increased capacity have thus been employed so that, information processors, such as personal computers, with higher performance and higher processing speeds are being produced.

FIG. 6 is a circuit diagram illustrating a conventional word decoder and word driver for a DRAM. Generally, a plurality of sections called memory banks are provided on a semiconductor chip, with a plurality of memory cell blocks and sense amplifiers being provided in each of the memory bank areas. In FIG. 6 are shown a memory cell block 3 and an adjacent sense amplifier SA. A plurality of cell matrixes 4 are provided in the memory cell block 3. A plurality of word lines WL and a plurality of intersecting bit lines thereto (not shown) lie in the cell matrix 4. A memory cells (not shown) are located at each point of the intersection of the word lines and the bit lines.

Since a load of the word line have increased in accordance with the increased capacity of the recent memory, it is difficult for the word lines in the memory cell block 3 to be collectively driven by a single word driver, as in a conventional manner. To resolve this problem, the word lines are divided into a plurality of sub-word lines, with each sub-word line being driven by a sub-word driver SWD, which is provided adjacent to the cell matrix 4. In the example in FIG. 6, 256 word lines are provided in the memory cell block 3, a main word decoder 5 selects groups of four word lines among 256 word lines. And a sub-word decoder 6 selects one of the selected four word lines.

As is shown in FIG. 6, inverted and non-inverted main word selection signals MWX 0 and MWX 1, and MWZ 0 and MWZ 1, are output by the main word decoder 5. Sub-word selection signals SWD 0 through SWD 3 are output by the sub-word decoder 6. Address signals 7 and 8 are supplied by a predecoder to the decoders 5 and 6. The sub-word driver SWD receives the main word selection signals and the sub-word selection signals, and drives the sub-word lines in the selected row.

Thus, as is shown in FIG. 6, the areas for the sub-word drivers are provided between the cell matrixes 4 and adjacent to the cell matrixes 4 in the column direction. As memory capacity grows larger, the number of the sub-word lines is increased and the areas for the sub-word drivers driving them are also increased, giving rise to one of the problems accompanying the increase in memory capacity.

FIG. 7 is a detailed diagram illustrating the conventional sub-word driver shown in FIG. 6. FIG. 8 is a table for explaining the operation of the conventional sub-word driver. The sub-word driver in FIG. 7 is a CMOS circuit comprised by a P-channel transistor Q1 and N-channel transistors Q2 and Q3. The sub-word driver is connected to the sub-word line WL. BL represents a bit line and MC represents an example memory cell having a single transistor. The main word selection signal MWX is transmitted to the gate electrodes of the transistors Q1 and Q2, and the main word selection signal MWZ, which is an inverted signal thereto, is transmitted to the gate electrode of the transistor Q3. Further, sub-word selection signal SWP0 is supplied to the P channel transistor Q1 and the N channel transistor Q3.

The operation will be briefly described. First, when both the main word selection signal MWX, MWZ and the sub-word selection signal SWD0 are in a selected state, as is shown in FIG. 8, the selection signals MWX, MWZ and SWD0 are at level $V_{ss}$ (ground level), level $V_{cc}$ (power supply voltage level), and level $SV_c$ (higher level than power supply voltage level). As a result, the transistors Q1 and Q3 are rendered on, the transistor Q2 is rendered off, and the word line WL is driven to the high level $SV_c$ of the sub-word selection signal SWD0. When the main word selection signals MWX, MWZ are in selected state and the sub-word selection signal is in a non-selected state, the potentials of the signals are MWX=L, MWZ=H, SWO=1 as shown in FIG. 8. As a result, since the sub-word selection signal SWD0 is reduced to level $V_{ss}$ (ground level), even though the P-channel transistor Q1 is in the ON state, the word line WL is at level L. However the potential of the word line WL can not be reduced to the point equal to or lower than the gate potential $V_{ss}$ of the transistor Q1 plus the threshold voltage Vth through the P-channel transistor Q1 only, and is in the floating state. Therefore, the N-channel transistor Q3 is additionally provided. The transistor Q3 is rendered on to ensure the clamping of the word line W to the level $V_{ss}$ of the sub-word selection signal SWD0.

When the main word selection signal is in the non-selected state, the main word selection signal MWX goes to level H and N-channel transistor Q2 is rendered on. The word line WL is therefore set to level $V_{ss}$, regardless of the state of the sub-word selection signal SWD0.

As is described above, three transistors and the supply of three selection signals are required for the sub-word driver in FIG. 7.

In FIG. 9 is shown another example CMOS circuit for a conventional sub-word driver circuit. The table in FIG. 10 shows the levels of selection signals for explaining the operation of the sub-word driver. When a main word selection signal MNX is in the selected state, and a sub-word selection signals SWDZ, SWDX are in the selected state, the main word selection signal MWX is at level $V_{ss}$ (ground level), and a P-channel transistor Q4 is rendered on. A word line is driven at level $SV_c$, higher than the power supply voltage $V_{cc}$ which is supplied to the sub-word selection signal SWDZ, and goes to level $SV_c$. When the main word selection signal MWX is in the selected state, and the sub-word selection signals SWDZ, SWDX are the non-selected state, the sub-word selection signal SWDZ goes to level $V_{ss}$ and the word line WL is set to level L through the transistor Q4. As well as in FIG. 6, however, in accordance with the property of the P-channel transistor Q4, the potential of the word line WL is floating at a level obtained by adding the threshold voltage value to the potential level $V_{ss}$ of the gate electrode of the transistor Q4. Therefore, an N-channel transistor Q6 is provided as a clamping transistor to forcibly set the word line WL at level $V_{ss}$.

Therefore, the work driver in FIG. 9 also requires three transistors and three control signals.

As previously described, when the word line is divided into sub-word lines each of which is driven by a sub-word driver, three transistors are required for the conventional sub-word driver and three selection signals must be supplied thereto.

As is shown in the area of the memory cell block 3 in FIG. 6, a plurality of sub-word drivers are positioned in the column direction, and three selection signals are supplied to each of the drivers. The dimensions of the area occupied by the circuits and their selection signal lines prevents the provision of a microstructure in according to the increased memory capacity.

SUMMARY OF THE INVENTION

It is therefore one object of the present invention to simplify the structure of a sub-word driver.

It is another object of the present invention to provide a memory circuit having simpler sub-word drivers.

It is an additional object of the present invention to provide a memory circuit having sub-word drivers for which operational control requires fewer control signals.

It is a further object of the present invention to provide a sub-word driver that is constituted by two transistors and for which two selection signals are used for control.

To achieve the above objects, the present invention provides the following word driver. The word driver, in a memory circuit to which a voltage from a first power supply and a second power supply higher than the first power supply are supplied, comprises:

a first transistor of a first conductive type and a second transistor of a second conductive type, having a gate electrode connected to a gate of the first transistor, one source or drain electrode operatively connected to one source or drain electrode of the first transistor, and another source or drain electrode connected to the first power supply. A word line is connected to the commonly connected source or drain electrodes of the first and the second transistors. A first selection signal, generated by decoding a first address signals group, whose potential is either a first potential, by which the second transistor is rendered conductive, or a second potential lower than a potential of the first power supply, is supplied to the commonly connected gate electrodes of the first and the second transistors. A second selection signal, generated by decoding a second address signals group, whose potential is either a third potential of the word line in a selected state or a fourth potential equal to or lower than the first power supply, is supplied to another source or drain electrode of the first transistor.

The first conductive type transistor is, for example, a P-channel MOS transistor, and the second conductive type transistor is, for example, an N-channel MOS transistor.

Preferably the second potential is lower, by the threshold voltage or more of the first transistor, than the potential of the first power supply. Actually, it is practical and easy that the second potential is a substrate bias potential that is generated in the memory circuit.

To further stabilize the operation, it is preferable that the fourth potential be lower than the potential of the first power supply. It is practical, for example, for the fourth potential as well as the second potential to be the substrate bias potential.

With this arrangement, the word driver is constituted only by two transistors and requires only two control selection signals. Since in this structure the potential to be supplied to the gate electrode of the first P-channel transistor is lower, by the equivalent of the threshold voltage value or more, than the ground level, the potential of the word line connected to the source or drain electrode of the first transistor can be clamped at a sufficiently low level.

DETAILED DESCRIPTION OF THE PREFERRED EMBODIMENT

The preferred embodiment of the present invention will now be described. The circuit shown in the following drawings is used merely for the embodiment, and it is obvious that the technical scope of the present invention is not limited to such a circuit.

[Word Driver]

Figures 1, 2:
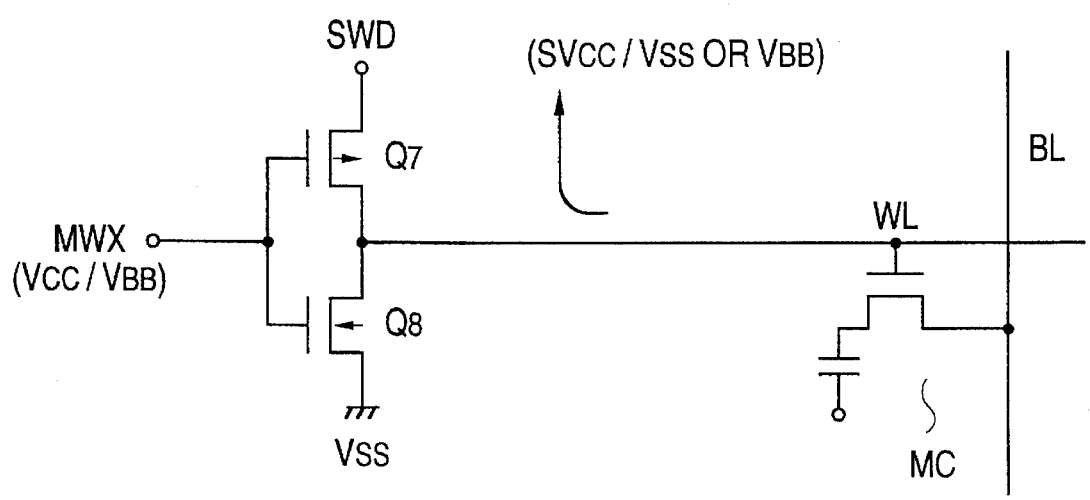
FIG. 1 is a diagram illustrating a sub-word driver circuit according to the present invention.
FIG. 2 is a table for explaining the operation of the circuit in FIG. 1.

In FIG. 1 is shown a sub-word driver circuit according to the present invention. This example sub-word driver is a CMOS circuit including a P-channel transistor Q7 and an N-channel transistor Q8. A main word selection signal MWX is supplied to a common gate electrode thereof. A sub-word selection signal SWD is supplied to source or drain electrode of the transistor Q7, which is opposite to a word line WL. The potential of the main word selection signal MWX in the selected state is lower than the level $V_{ss}$ (ground level), which differs from the prior art. The potential of the sub-word selection signal SWD in the non-selected state is equal to or lower than level $V_{ss}$ (ground level).

A substrate bias potential $V_{BB}$, which is generated as a potential of a semiconductor substrate, is used as an example of the potential lower than the level $V_{ss}$ (ground level). It should be noted that the potential does not have to be equal to the substrate bias potential; it needs only be low enough for the word line WL in the non-selected state to be reduced to the level $V_{ss}$ (ground level).

The operation of the sub-word driver in FIG. 1 will now be explained while referring to FIG. 2. First, when both the main word selection signal MWX and the sub-word selection signal SWD are in the selected state, the word line WL is also in the selected state. At this time, the main word selection signal MNX is set to the level $V_{BB}$, which is lower than the ground level, and the sub-word selection signal SWD goes to level $SV_c$, which is higher than the power supply voltage $V_{cc}$. As a result, the P-channel transistor Q7 is rendered on and the potential of the word line WL is increased to level $SV_c$, which is the same as that of the sub-word selection signal SWD. Then, the transistor in a memory cell MC is rendered on, and the level of a bit line BL rises or falls in accordance with the condition that is stored in a capacitor.

When the main word selection signal MWX is in the selected state, and the sub-word selection signal SWD is in the non-selected state, the word line WL is changed to the non-selected state and its potential needs to be reduced to the ground level. According to the property of the P-channel transistor, the potential of the word line WL goes to the voltage of the gate electrode plus threshold voltage $V_{th}$. Since in this embodiment the main word selection signal MWX has a substrate bias potential lower than the ground level, the potential level of the word line WL is $V_{BB}+V_{th}$. Therefore, if the substrate bias voltage $V_{BB}$ is lower than the potential the ground level minus the threshold voltage $V_{th}$ or more of the P-channel transistor Q7, the level of the word line WL is equal to or lower than the ground potential.

The potential of the sub-word selection signal SWD in the non-selected state is the level $V_{ss}$ (ground level) or lower, a substrate bias potential $V_{BB}$, for example. It is desirable that the potential of the sub-word selection signal SWD be a substrate bias potential, which is lower than the ground level, in order to set more stably the word line WL to the ground potential level or lower in the non-selected state.

When the main word selection signal MWX is in the non-selected state, its potential level is equal to high power supply voltage level $V_{cc}$. Normally, the power supply voltage $V_{cc}$ is set to 3 volt or 3.6 volt. As a result, in the sub-word driver, the N-channel transistor Q8 is rendered on, and the level of the word line WL is clamped at the ground level $V_{ss}$ via the transistor Q8. This is not affected by the state of the sub-word selection signal.

As is described above, the word driver circuit driving the word lines is constituted by two transistors, and employs two selection signals for control. As the minimum requirements, the level in the selected stat of the main word selection signal MWX, which is supplied to the gates of both transistors Q7, Q8, should be lower, by the threshold voltage of the P-channel transistor Q7, than the level of the word line in the non-selected state. With this arrangement, the word line WL can be adequately clamped at the level of the sub-word selection signal SWD in the non-selected state. Further, taking into consideration an increase in voltage on the sub-word selection signal line, which runs between the sub-word decoder and the transistor Q7, and other factors, it is also preferable that the potential of the sub-word selection signal SWD be sufficiently lower than the level of the word line in the non-selected state.

The main word selection signal and the sub-word selection signal do not have to be supplied as is shown in FIG. 1, and may be supplied to opposite terminals. More specifically, a first selection signal generated by decoding a first group of address signals and a second selection signal generated by decoding a second group of address signals only need be supplied to the common gate electrode of the CMOS circuit in FIG. 1 and the source or drain electrode of the P-channel transistor Q7.

[General Structure of a Memory Cell Block]

Figure 3:
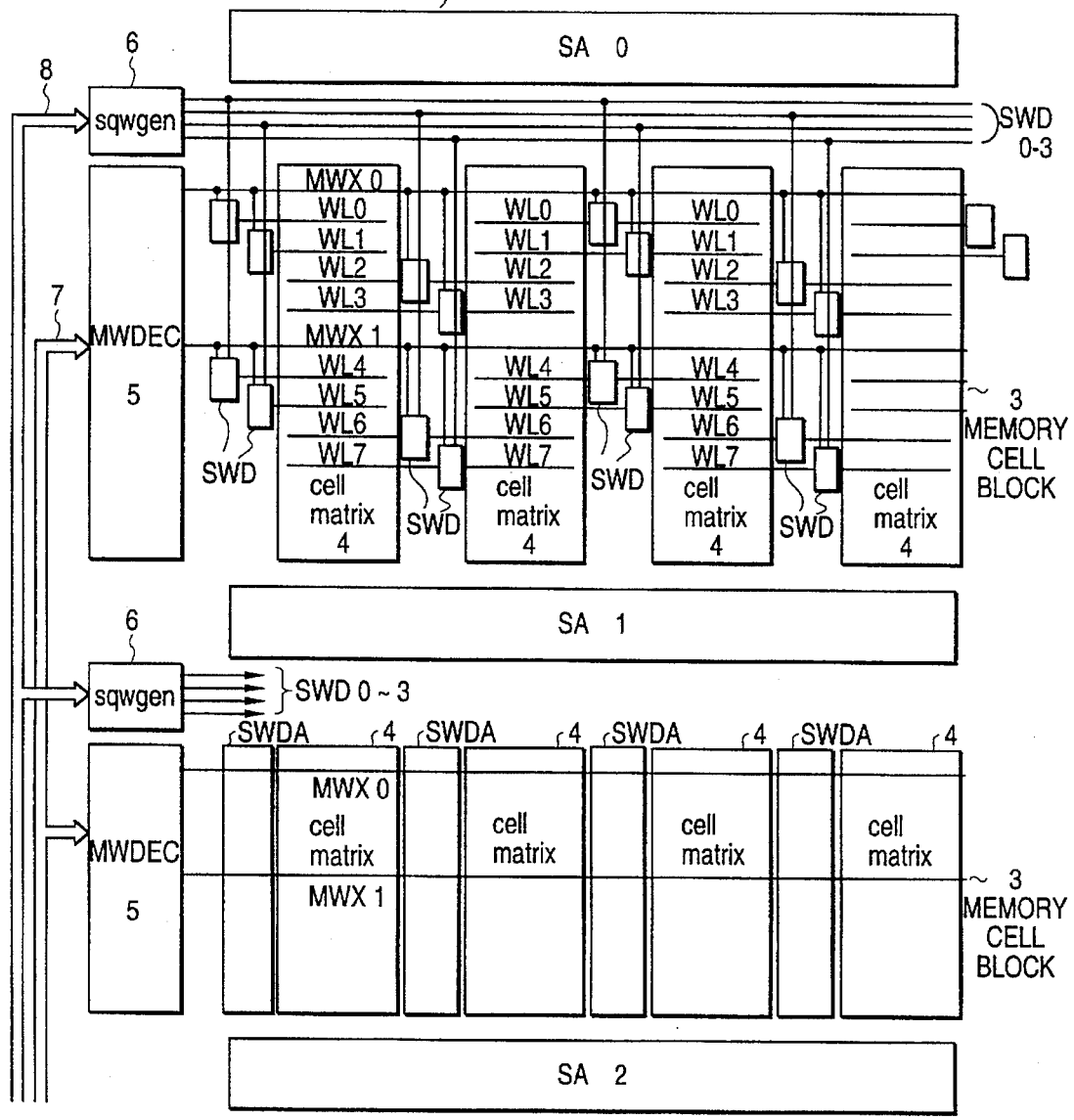
FIG. 3 is a diagram illustrating the general structure of a memory cell block according to the present invention.

In FIG. 3 is shown the general structure of a memory cell block for which the sub-word driver in FIG. 1 is employed. A complete memory bank 2 is illustrated in FIG. 3. As is described above, a plurality of such memory banks 2 are provided on a semiconductor chip. A plurality of memory cell blocks 3 are formed in the memory bank 2. In FIG. 3, two memory cell blocks 3 are shown.

As is schematically shown in the lower half of FIG. 3, sense amplifiers SA1 and SA2 are located adjacent to the memory cell block 3 at the top and the bottom thereof. Further, cell matrixes 4 and the sub-word drivers array SWDA are alternately arranged in the memory cell block 3. A main word decoder 5 and a sub-word decoder 6 are provided for each cell array block 3 for the selection of word lines. Main word selection signals MWX 0 and MWX 1, from the main word decoder 5, and sub-word selection signals SWD 0 through SWD 3, from the sub-word decoder 6, are supplied to the sub-word driver SWD. When both selection signals are in the selected state, the sub-word driver circuit drives the word line WL to raise it to level H. An address signal 7 and a block selection signal 8 are supplied from respective predecoders (not shown).

In the upper half of the memory cell block 3 in FIG. 3 is shown how the main word selection signal MWX0, 1 and the sub-word selection signal SWD0~3 are supplied to the sub-word driver circuit SWD. The main word decoder 5 outputs the main word selection signal MWX for the selection of four word lines from a total of, for example, 256 word lines in a single memory cell block 3. The 64 main word selection signals MWX are supplied to the sub-word drivers SWD which are connected to the respective divided word lines WL. The sub-word decoder 6 supplies the sub-word selection signals SWD 0 through SWD 3 to the respective sub-word drivers SWD for the selection of one of the four word lines.

In the example shown in FIG. 3, the sense amplifiers SA 0 to SA 2 are provided adjacent to the memory cell block 3 at the top and the bottom thereof. With this arrangement, adjacent memory cell blocks 3 can use in common the sense amplifier located between them, and the area allocated for occupation of the sense amplifiers can be reduced. That is, the sense amplifiers are shared by the adjacent memory cell blocks 3. The bit lines are not shown in FIG. 3 in order to simplify the drawing.

Figure 4A:
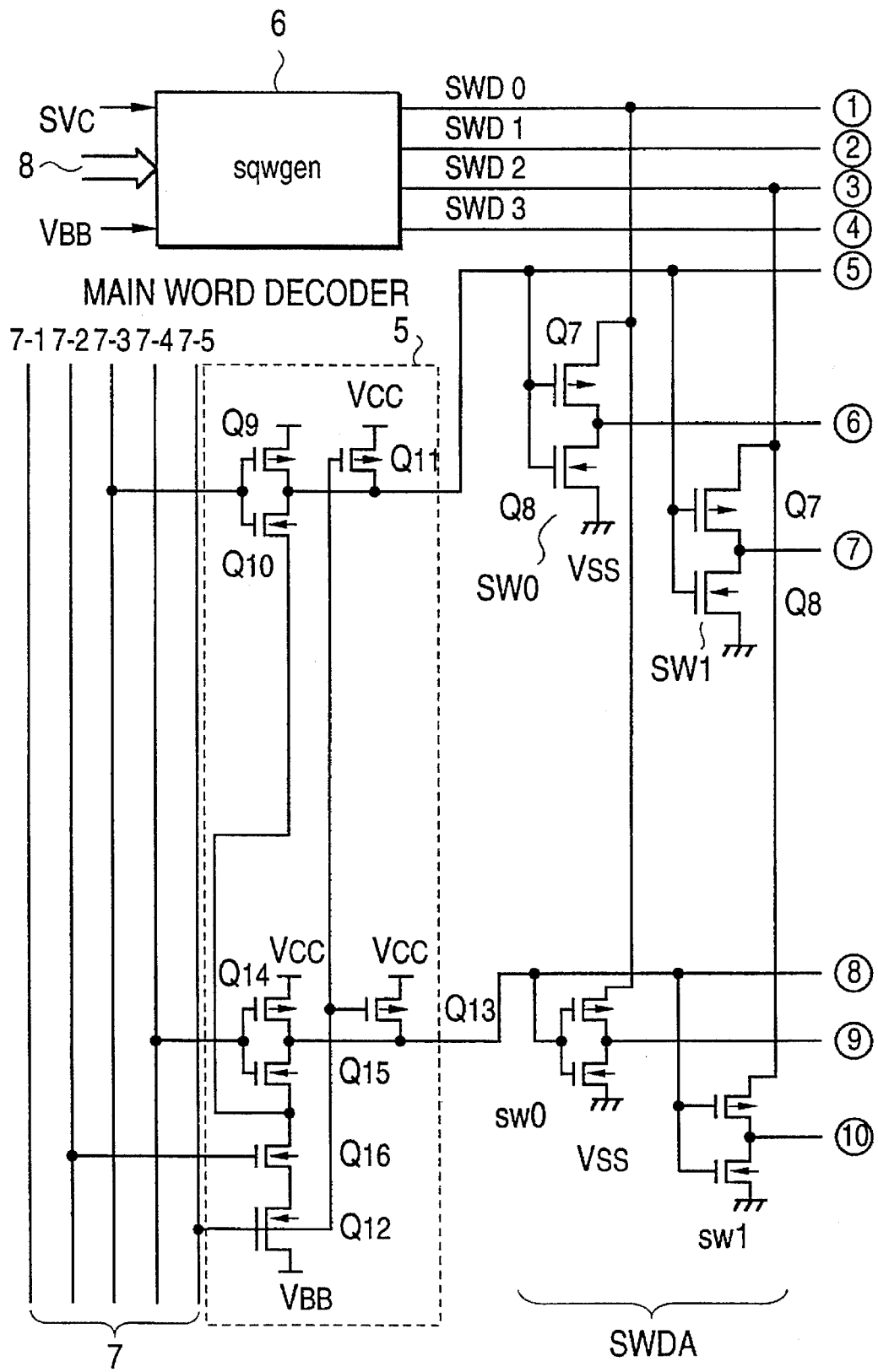
FIGS. 4A and 4B is a detailed circuit diagram illustrating the memory cell block according to the present invention.
Figure 4B:
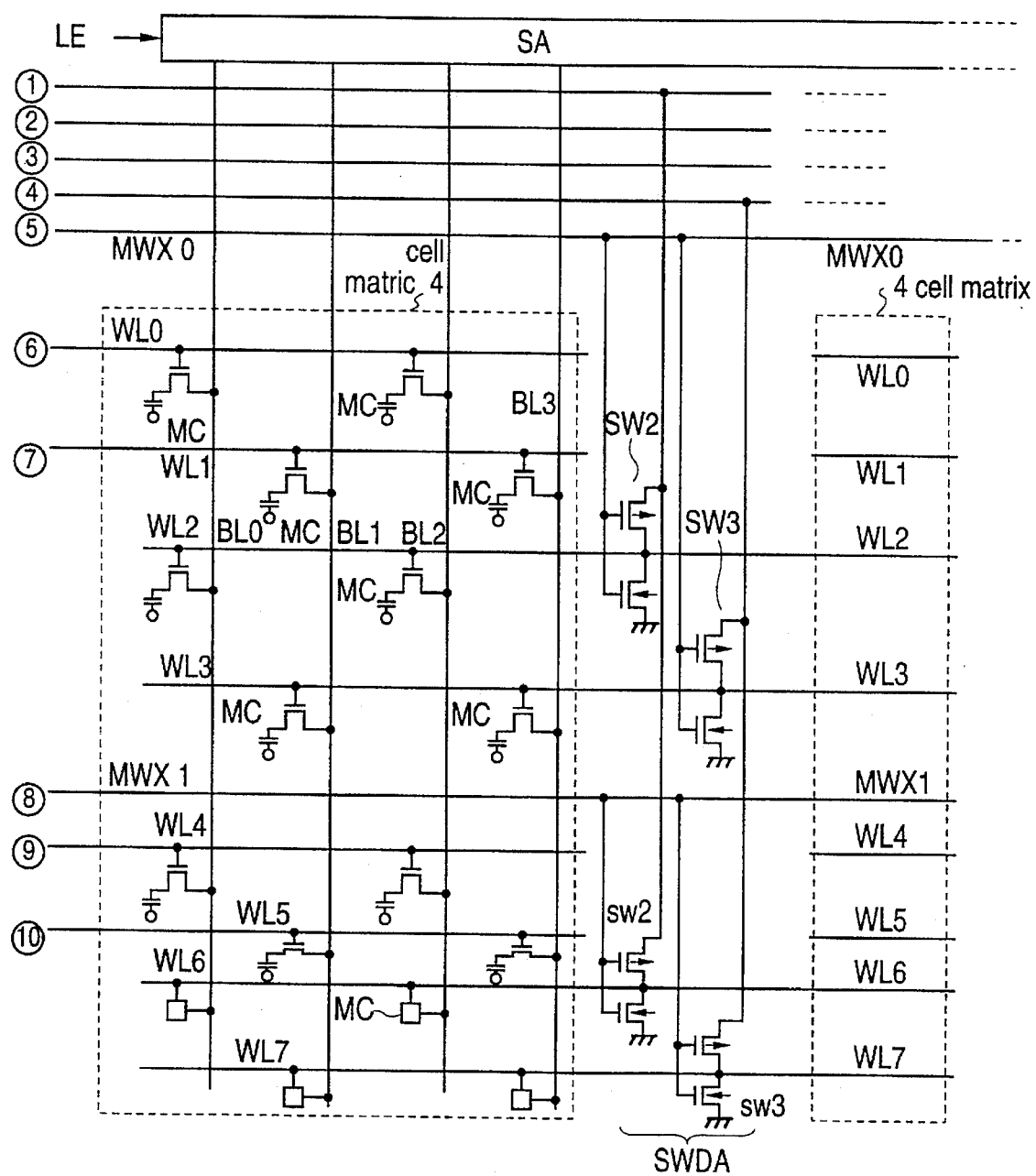

FIG. 4 is a detailed circuit diagram illustrating the memory cell block in FIG. 3. Word lines WL 0 through WL 7 are separately located in the direction of rows. Bit lines BL are connected to an adjacent sense amplifier SA. Memory cells MC are located at the intersections of the word lines WL and the bit lines BL. In FIG. 4 is shown an example constituted by a single N-channel transistor and a single capacitor. Sub-word driver SW 0 is connected to word line WL 0. Sub-word driver SW 1 is connected to word line WL 1. Word lines WL 2 and WL 3, provided in cell matrix areas on both sides, are connected to sub-word drivers SW 2 and SW 3. Each of these sub-word drivers is shown in FIG. 1, and selection signals SWD 0 through SWD 3, corresponding to the sub-word decoder 6, are supplied to the source or drain electrode of the P-channel transistor Q7.

As is shown in FIG. 4, while the higher power supply voltage of the main word decoder 5 is $V_{cc}$, the substrate bias voltage $V_{BB}$ is used as a lower potential. As circuit examples for the main word decoder 5, two decoder circuits are shown, constituted by P-channel transistors Q9, Q11, Q13 and Q14, and N-channel transistors Q10, Q12, Q15 and Q16. A block selection signal 7-5 (one of a set of address signals 7) is supplied in common to the transistors Q11, Q12, and Q13. Further, different address signals 7-1, 7-2, 7-3, 7-4 are transmitted to the transistors, Q9, Q10 and Q14, and Q15 and Q16. When the block selection signal 7-5 goes to level H, the transistor Q12 is rendered on and the entire main word decoder becomes active. Sequentially, in accordance with the states of the remaining address signals 7-1~7-4, the decoders 5 set the selection signals MWX 0 MWX 1 to the level for the selected state or to the level for the non-selected state.

In case the main word selection signal MWX 0 is set to the selected state, for example, address signal 7-3 goes to level H, address signal 7-2 goes to level H, and the transistors Q10 and Q16 are rendered on. As a result, the potential of the main word selection signal MWX 0 is the substrate bias potential $V_{BB}$. On the other hand, address signal 7-4 goes to level L, the transistor Q14 is rendered on, and the potential of the main word selection signal MWX 1 is $V_{cc}$ (level H).

The same structured circuit is employed for the sub-word decoders 6, which output potentials at the level $SV_c$ and the level $V_{BB}$ the sub-word selection signals SWD0~3. The sub-word driver circuit SWD receiving the both selection signals performs the operation described referring to FIGS. 1 and 2.

Figure 5:
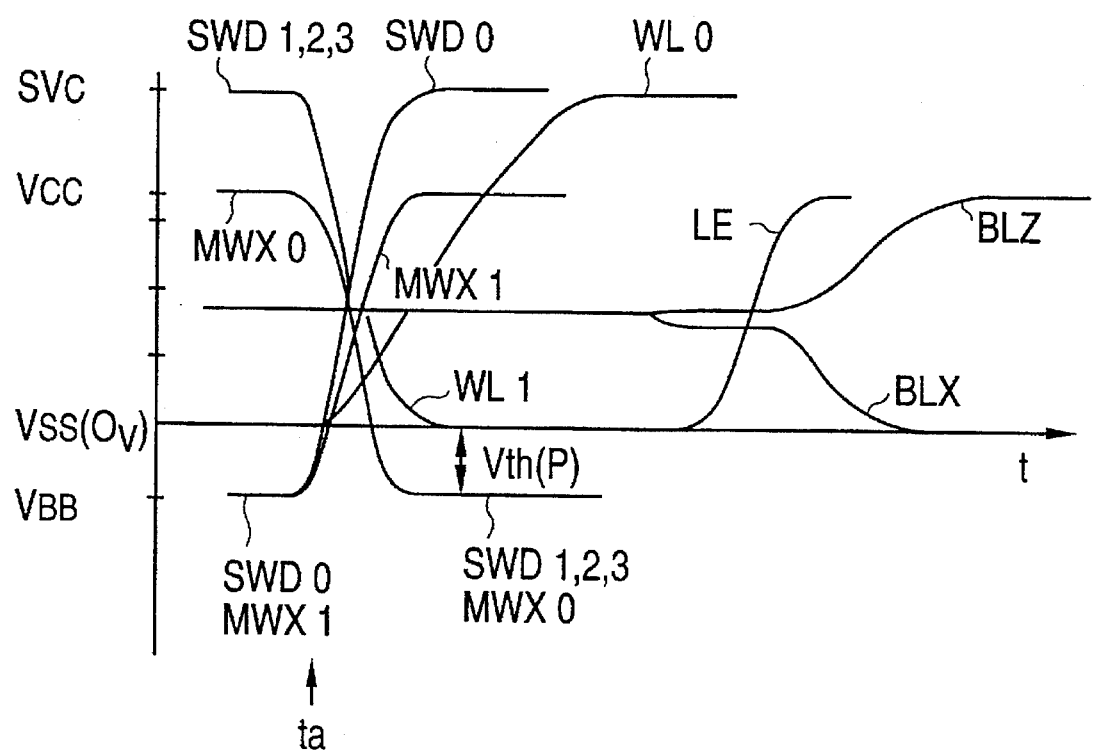
FIG. 5 is a timing chart of one embodiment of the present invention.
Figure 6A:
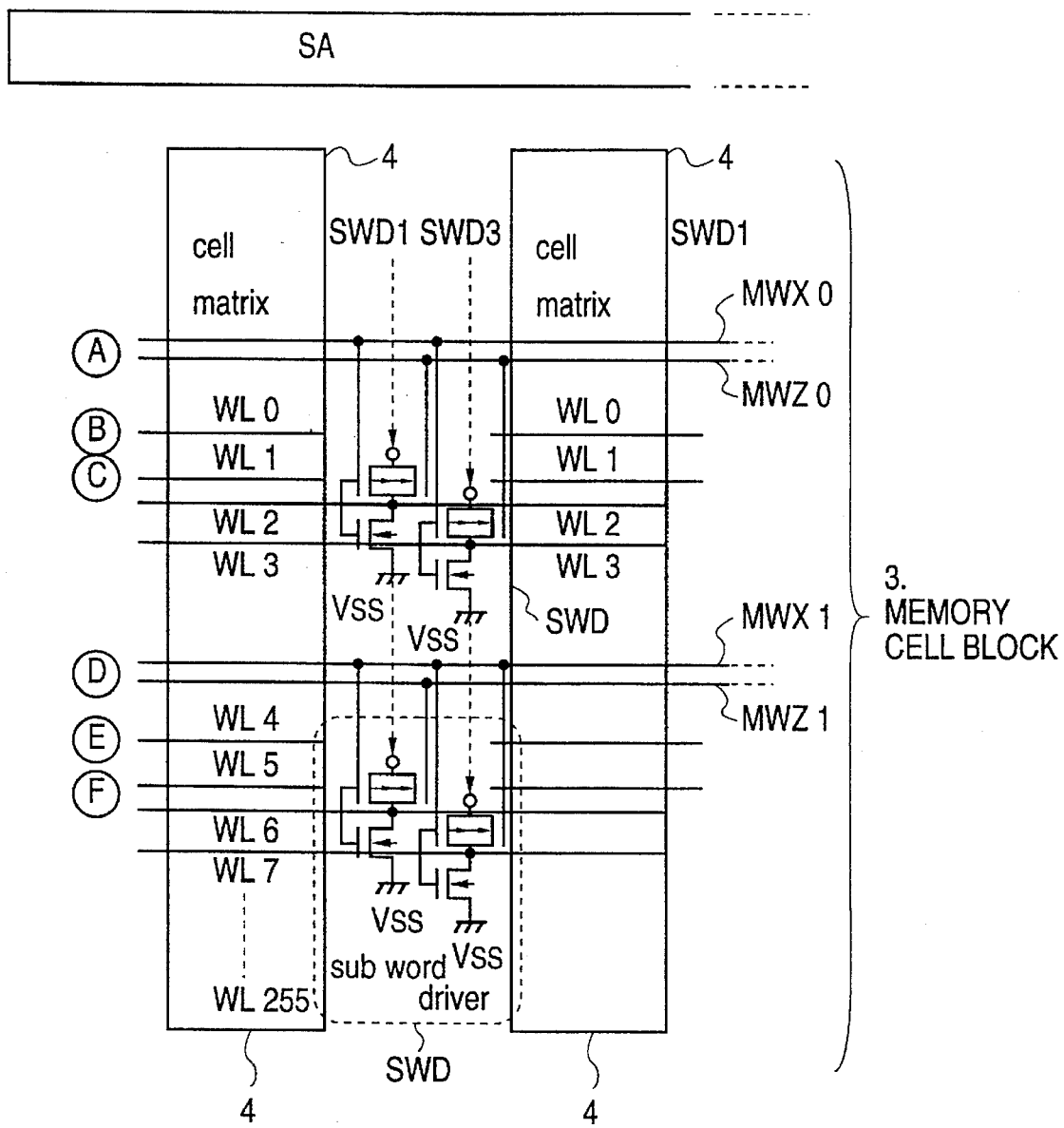
FIGS. 6A and 6B is a diagram illustrating prior art.
Figure 6B:
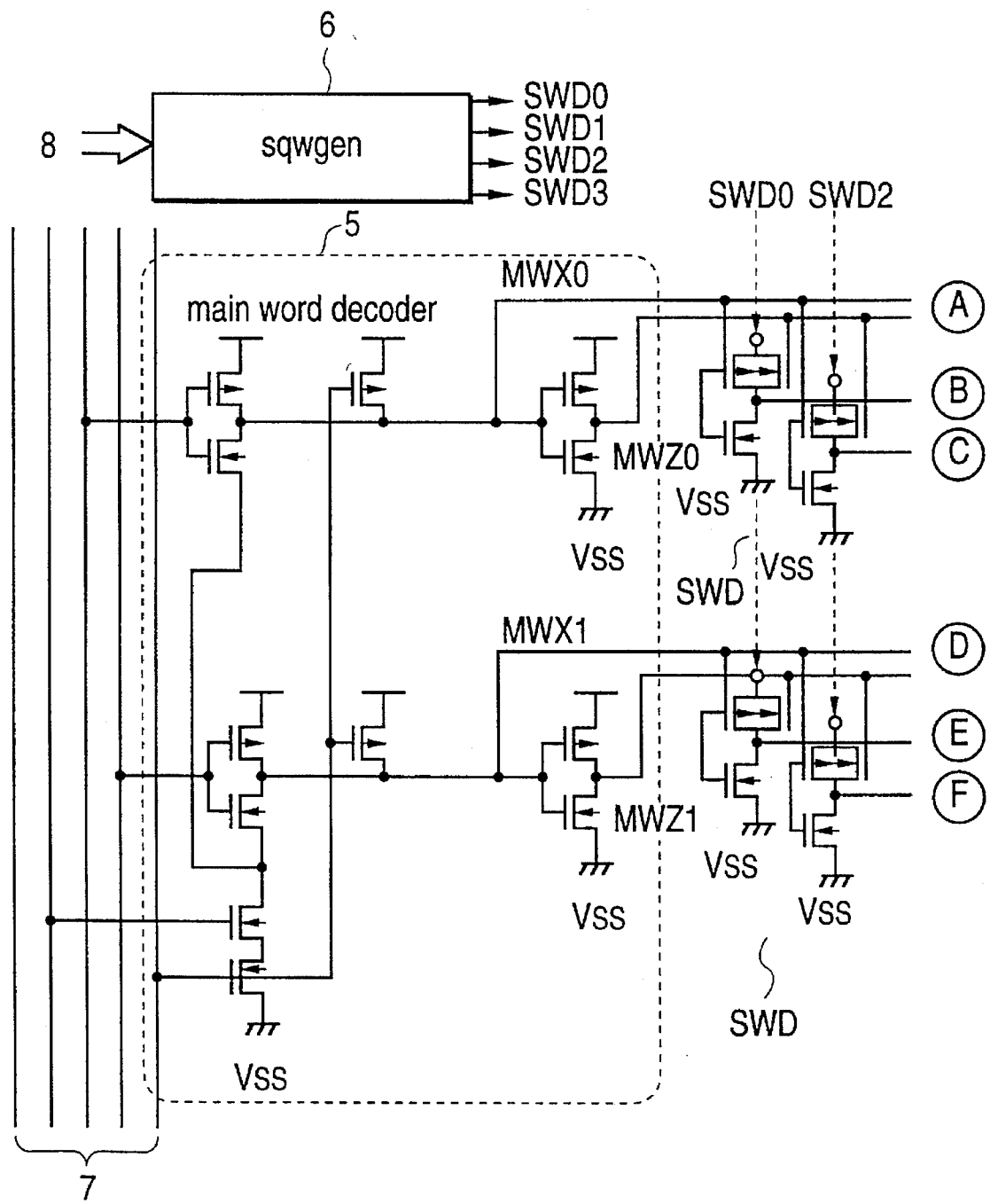
Figures 7, 8:
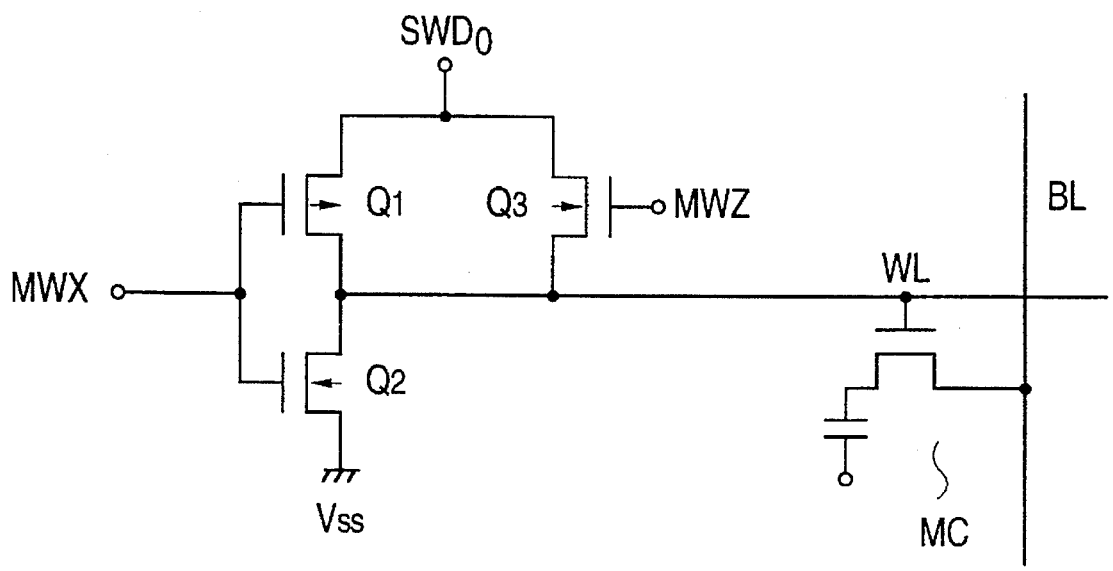
FIG. 7 is a diagram showing a conventional sub-word driver circuit.
FIG. 8 is a table for explaining the operation of the circuit in FIG. 7.
Figures 9, 10:
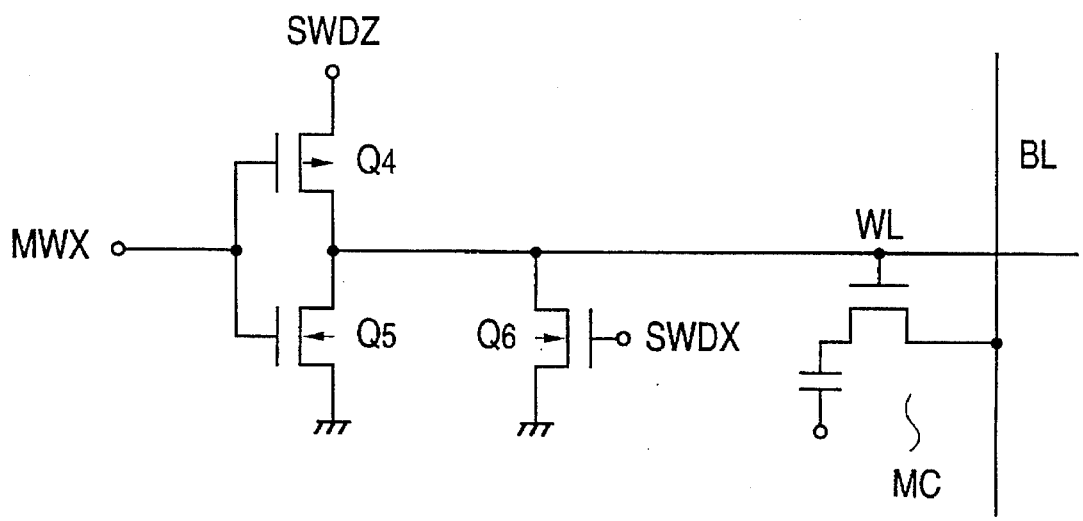
FIG. 9 is a diagram illustrating another conventional sub-word driver circuit.
FIG. 10 is a table for explaining the operation of the circuit in FIG. 9.

FIG. 5 is a timing chart for the embodiment of the present invention when the word line WL 0 is selected in the example in FIG. 4. The potential of the sub-word selection signal SWD0 is the substrate bias voltage $V_{BB}$ in the non-selected state.

As is shown in FIG. 5, at time ta for a timing of a low address strobe signal RAS, for example, the memory circuit becomes active. Consequently, the outputs of the individual decoders vary in accordance with the supplied address signals. Since the word line WL 0 is selected in FIG. 5, the potential of the main word selection signal MWX 0 falls from the power supply voltage level $V_{cc}$ to the substrate bias potential $V_{BB}$, and the potential of the sub-word selection signal SWD 0 rises from the substrate bias potential $V_{BB}$ to the level $SV_c$, which is higher than the power supply voltage $V_{cc}$.

On the other hand the potentials of the sub-word selection signals SWD 1 through SWD 3, corresponding to the non-selected word line, fall to the substrate bias potential $V_{BB}$, and the potential of the main word selection signal MWX 1 rises to the power voltage $V_{cc}$.

As a result, as is explained while referring to FIG. 1, the sub-word driver SW 0 drives the word line WL 0 so as to rise to the level $SV_c$. The other sub-word drivers SW 1 through SW 3 connect the word lines to the sub-word selection signals SWD 1 to SWD 3, which are at the level of the substrate bias potential $V_{BB}$ via the P-channel transistor Q7, so that the word lines are clamped to level L.

Latch enable signal LE is supplied to the sense amplifier SA when the potential of the word line WL 0 increases, and the rising level or falling level read on the bit lines BL in accordance with the information in the memory cell MC is amplified by the sense amplifier SA.

As is described above, according to the present invention, the sub-word driver is provided by using two transistors, and the selection signals to be supplied thereto are only two. Thus, as is shown in FIGS. 3 and 4, the dimensions of the array area required for the sub-word driver can be reduced.

What we claim are:

1. A word driver circuit provided in a memory circuit to which a first power supply and a second power supply higher than the first power supply are supplied, the word driver circuit comprising:

a first transistor of a first conductive type; and a second transistor of a second conductive type having a gate electrode connected to the gate of the first transistor, one source or drain electrode operatively connected to one source or drain electrode of the first transistor, and another source or drain electrode connected to the first power supply;

wherein a word line is connected to the commonly connected source or drain electrode of the first and second transistors, a first selection signal, generated by decoding a first group of address signals, whose potential is either a first potential by which the second transistor is rendered conductive or a second potential lower than the first power supply is supplied to the commonly connected gate electrodes of the first and second transistors, and a second selection signal, generated by decoding a second group of address signals, whose potential is either a third potential of the selected word line or a fourth potential equal or lower than the first power supply is supplied to another source or drain electrode of the first transistor.

2. A word driver circuit according to the claim 1, wherein:

said second potential has a level lower than the potential of the first power supply minus a threshold voltage of the first transistor.

3. A word driver circuit according to the claim 1, wherein:

said fourth potential is lower than the potential of the first power supply.

4. A word driver circuit according to the claim 3, wherein:

said fourth potential is almost same level as the second potential.

5. A word driver circuit according to the claim 1, wherein:

said second potential is a potential of a substrate bias voltage generated in the memory circuit.

6. A word driver circuit according to the claim 1, wherein:

said fourth potential is a potential of a substrate bias voltage generated in the memory circuit.

7. A word driver circuit according to the claim 1, wherein:

said first potential is the same potential as or the similar potential to the second power supply.

8. A word driver circuit in a memory circuit to which a first power supply and a second power supply higher than the first power supply are supplied, the word driver circuit comprising:

a first and second input terminals;

an output terminal connected to a word line;

a first transistor with P type channel having a gate operatively connected to the first input terminal, one source or drain electrode operatively connected to the second input terminal, and another source or drain electrode operatively connected to the output terminal; and a second transistor with N channel having a gate operatively connected to the first input terminal, one source or drain electrode operatively connected to the first power supply, and another source or drain electrode operatively connected to the output terminal;

wherein a first selection signal, generated by decoding a first group of address signals, whose potential is either a first potential by which the second transistor is rendered conductive or a second potential lower than the first power supply is supplied to the first input terminal, and a second selection signal whose potential is either a third potential of the selected word line or a fourth potential equal or lower than the first power supply is supplied to the second input terminal.

9. A word driver circuit according to the claim 8, wherein:

said second potential is a potential of a substrate bias voltage generated in the memory circuit.

10. A word driver circuit according to the claim 8, wherein:

said fourth potential is a potential of a substrate bias voltage generated in the memory circuit.

11. A memory circuit being supplied a first power supply with a ground level and a second power supply higher than the first power supply, the memory circuit comprising:

a plurality of word lines provided in raws, each of which is divided into plural sub-word lines at each raw;

a plurality of bit lines crossing to the word lines;

a plurality of memory cells provided at the cross section of the word and bit lines;

a main word decoder for decoding a first group of addresses to provide a main word selection signal;

a sub-word decoder for decoding a second group of addresses to provide a sub-word selection signal; and a plurality of sub-word driver circuits being supplied the main word selection signal and the sub-word selection signal and connected to said sub-word line in the corresponding raw, said sub-word driver comprising a first input terminal being supplied the main word selection signal, a second input terminal being supplied the sub-word selection signal, an output terminal operatively connected to the sub-word line, a first transistor with P type channel having a gate operatively connected to the first input terminal, one source or drain electrode operatively connected to the second input terminal, and another source or drain electrode operatively connected to the output terminal, and a second transistor with N channel having a gate operatively connected to the first input terminal, one source or drain electrode operatively connected to the first power supply, and another source or drain electrode operatively connected to the output terminal;

wherein the main word selection signal becomes a first potential necessary to cause the second transistor conductive in a non-selected state and becomes a second potential lower than the first power supply in a selected state, and the sub-word selection signal becomes a third potential of the selected word line in a selected state and becomes a fourth potential equal or lower than the first power supply in a non-selected state.

12. A memory circuit according to the claim 11, wherein:
said second potential is a potential of a substrate bias voltage generated in the memory circuit.

13. A memory circuit according to the claim 11, wherein:
said fourth potential is a potential of a substrate bias voltage generated in the memory circuit.

14. A memory circuit being supplied a first power supply with a ground level and a second power supply higher than the first power supply, the memory circuit comprising:

a plurality of word lines provided in raws, each of which is divided into plural sub-word lines at each raw;

a plurality of bit lines crossing to the word lines;

a plurality of memory cells provided at the cross section of the word and bit lines;

a first word decoder for decoding a first group of addresses to provide a first selection signal;

a second word decoder for decoding a second group of addresses to provide a second selection signal; and a plurality of word driver circuits being supplied the first word selection signal and the second selection signal and connected to said sub-word line in the corresponding raw, said word driver circuit comprising a complimentary MOS transistor circuit, wherein the first selection signal becomes a first potential with the level of the second power supply or a second potential lower than the first power supply depending on a selection or non-selection state, and the second selection signal becomes a third potential with the level of selected sub-word line or a fourth potential lower than the first power supply depending on a selection or non-selection state.

* * * * *